United States Patent [19]

O'Connell

[11] 3,948,171

[45] Apr. 6, 1976

[54] METHOD FOR PRINTING MULTICOLOR HALFTONE IMAGES ON CYLINDRICAL OBJECTS

[75] Inventor: Richard E. O'Connell, Arlington Heights, Ill.

[73] Assignee: National Can Corporation, Chicago, Ill.

[22] Filed: May 2, 1974

[21] Appl. No.: 466,305

[52] U.S. Cl. .................. 101/211; 96/30; 96/38; 96/45; 101/40
[51] Int. Cl.² ................ B41M 1/14; B41F 17/22
[58] Field of Search ................. 101/211, 40; 96/30–32, 38, 45, 116

[56] References Cited
UNITED STATES PATENTS

| | | | |
|---|---|---|---|
| 787,209 | 4/1905 | McKee | 101/211 |
| 1,744,410 | 1/1930 | Morton | 101/211 |
| 1,885,725 | 11/1932 | Howland | 96/32 |
| 2,129,945 | 9/1938 | Lake | 96/30 |
| 2,700,609 | 1/1955 | Lando | 96/45 |
| 3,332,775 | 7/1967 | Mandler | 96/45 |
| 3,337,343 | 8/1967 | Hove | 96/31 |
| 3,381,612 | 5/1968 | Lecha | 101/211 X |
| 3,496,863 | 2/1970 | Cvacho et al. | 101/40 |

*Primary Examiner*—Clifford D. Crowder
*Attorney, Agent, or Firm*—Neuman, Williams, Anderson & Olson

[57] ABSTRACT

Halftone, multicolor printed effects are achieved by special preparation of art work in the desired preselected colors without blending and the use of only white as a diluent of color strength, forming color separated line-engraved press plates therefrom and applying the separate colors by offset printing to the workpiece without overprinting. A novel method and apparatus for producing halftone effect printing using these line-engraved press plates for printing cylindrical objects, and more particularly, cans of the two-piece type.

2 Claims, 9 Drawing Figures

METHOD FOR PRINTING MULTICOLOR HALFTONE IMAGES ON CYLINDRICAL OBJECTS

BACKGROUND OF THE INVENTION

1. Field of the Invention

This invention relates to the use of line-engraved press plates in the offset printing or lithographing of multicolor printed images having a visual halftone characteristic, and especially to the printing of said images on cylindrical objects, such as cans.

2. Description of the Prior Art

The printing or lithographing of cylindrical container or can surfaces is an established art in the container industry. The earliest procedures involved traditional offset printing in sequence on flat sheet metal or other surfaces in strip form which were subsequently cut and used to form the decorative or labeled body or side cylindrical wall of the well-known three-piece can construction. In this procedure separate colors are applied using halftone dot or grid type press plates to the flat tin plate surface, which is handled essentially in the same fashion as a paper sheet, and this printed strip is then cut to form the can cylinder to which a bottom is affixed and ultimately, after the canning process, a top lid is applied.

More recently, a can construction known as the two-piece can was developed wherein the entire can side wall and bottom were drawn from a single piece in the form of a cup and shipped to the user who would fill the can and apply a top in the normal canning process. Any printing, label or any other decoration applied to the can surface must be done after formation of the can since printing of the blank will not survive the deformation involved in the cupping or drawing procedures employed in this method. The printing techniques that have been developed for this so-called two-piece can construction are necessarily modified to provide for offset printing of multicolor images by direct application to the cylindrical surface. The methods employed include the formation of printing plates for each of several colors to be applied to the work. The traditional halftone lithograph effect by the use of printing mats prepared by the use of color separation, halftone dot or grid type screens and press plates, and overprinting have not been attainable in two-piece can printing since the problems of securing registry, proper printing pressure, angle of screen and plate, and the like to achieve the desired halftone effect attained by overprinting using halftone plates is, as a practical matter, difficult to accomplish.

The traditional grid or dot type screens used to form the halftone printing plates for multicolor printing produces a plate in which the printing surface is, in effect, a plurality of tiny raised dots or islands. The amount of color applied by each of the halftone plates was determined by the presence of and size of each of these dots, each of which, in turn, were formed photographically by traditional color separation and photoengraving techniques using appropriate filters and a halftone screen or grid. For each color, the grid and the resulting press plate is angled slightly to result in partial overprinting. The final composite multicolor shaded or toned printing product is achieved by overprinting and by optical blending, producing a visual effect of the desired tones or blends of color. Since each of the small dots formed in the press plate are fragile, the mechanical stress encountered in the application of each color to the offset surface or blanket results in smearing of the individual dots by the mechanical bending action encountered in the contact between the press plate and the surface of the offset blanket. This is especially true in the preparation of so-called flexible halftone press plates where the plate is formed by a chemical photoengraving method. In this procedure the plate is formed of a flexible, rubbery or polymeric material which has a photosensitive surface. On exposure to light, the photosensitive material is activated or hardened so that further treatment or etching, as by solvent, dissolves away the unexposed portions leaving a raised printing surface formed of a multitude of dots which corresponds to the particular color image applied to the plate. Since the base supporting the raised or printing portion is flexible, each printing operation flexes each dot and tends to smear the image and can also break the dots off.

Understandably, the quality of the image will deteriorate rapidly under these stresses, and such indeed is the experience in the can lithographing art. Likewise, the achievement of tone or color blend by traditional offset multicolor halftone techniques requires very accurate registry, careful angulation of the screens and press plates, accurate pressures, and more particularly, evenness of printing pressures. These desiderata were not attainable in the high speed printing techniques used for cylindrical objects or cans and required for economic operation in this industry. The result has been that halftone effects are not reproducible by any of the known standard multicolor offset or lithographic printing techniques which have been employed to date in the printing of two-piece cans.

Some of the prior art patents which deal with high speed can printing of two-piece metal cans include: Brigham, et al., U.S. Pat. No. 3,227,070; Brigham, U.S. Pat. Nos. 3,223,028 and 3,371,603; Freres, U.S. Pat. No. 3,385,209; and Maxin, U.S. Pat. No. 3,645,201. None of these patents, however, teach the successful use of a halftone color blend visual effect in high speed printing and all use solid color printing techniques.

SUMMARY OF THE INVENTION

The present invention relates to a method for preparing a set of line-engraved press plates for multicolor offset printing of an image having halftone qualities achieved without overprinting or blending of colors employed, and wherein each of the colors in the final printed image is separated from the other by the background or field color, which method comprises:

a. preparing the original art work in the original desired pre-selected colors without color blending and employing white as the sole diluent of color strength;

b. photographically forming color separated transparencies or continuous tone color separation films by the use of filters which represent the original colors;

c. forming line screen, reversal transparencies of the separated transparencies first prepared by photographing the same through a line screen wherein the screen lines are each in register and parallel with each other in each transparency; and d. photographically preparing a line-engraved press plate from each of the line screens, each plate representing each of the preselected colors of the original art work.

The present invention also relates to a method for printing multicolor images having halftone qualities which has no overprint of colors, which comprises:

a. preparing the art work in pre-selected colors without color blending and using white as a diluent of color strength;
b. forming a series of color separated transparencies representing the original art work colors;
c. forming a series of line screen color reversal transparencies from the separated transparencies first prepared;
d. forming a series of line-engraved press plates from said line screen transparencies wherein each press plate corresponds to one of the colors in the original art work and wherein the printed image from each of said press plates is separated from the color image of the other plates by the field color and the printing lines of the respective press plates are parallel to each other and run in the direction of printing;
d. applying ink in appropriate colors to each of the press plates;
applying the inked press plates to an offset surface in register so that the lines of each image applied to said offset surface are separated from the lines of the other colors applied to form a composite image; and
g. transferring the composite multicolor image from the offset surface to a workpiece to produce a multicolor image thereon having halftone visual qualities without color overprinting or blending.

The present invention includes an apparatus for printing multicolor images having a visual halftone effect on the outer surface of a cylindrical object without overprinting and employing line engraved press plates which comprises:

a. a frame means;
b. a driven cylindrical printing means having an offset printing surface on the outer circumference thereof mounted on said frame;
c. a plurality of printing cylinders arranged circumferentially around the outer surface of the offset printing surface adapted to sequentially contact the same;
d. a plurality of flexible line engraved press plates affixed to the surface of said printing cylinders, each adapted to print an image of a particular color on the printing surface in registry with other colors, the raised lines of said press plate running in the direction of rotation of said cylinder;
e. means for sequentially applying each of the images from the printing cylinders to the surface of the offset printing blanket in registry with each other to produce a multicolor composite image thereon without overprint or overlap of color;
f. means for bringing a rotating cylindrical workpiece surface into rolling contact with the offset printing blanket to transfer the image thereon to the surface of the cylindrical workpiece surface; and
g. means for removing the printed workpiece from engagement with the offset surface.

The preparation of the art work original is, as indicated, carried out in the original colors without color blending and using white as the sole diluent of color strength. The only requirement in selecting the original colors is that they are color separable by the use of optical filters. This permits clean separation of the color elements of the original in the process of making the press plates. The use of white as the diluent of color strength aids in the separation process.

The art work is photographed and separated by color filters and each color is projected through an appropriate halftone line screen to make the necessary halftone positive which is employed to produce the press plate.

One particular sequence which may be employed is to color separate directly from the art work using filters to form continuous tone negatives followed by projection through a line halftone line screen to make a halftone positive which may then be used to form the press plate by the chemical photoengraving process.

The use of halftone line screens eliminates many of the problems associated with the so-called dot or grid type halftone screen conventionally used in offset lithography. In this dot technique, to obtain the various color shadings, the grid screens are slightly angled or rotated when preparing the halftone screen positive for each color. The resultant positive is used to prepare the press plate series which are in turn angled and thereby produce overprinting or overlap of the particular dots associated with that color. It is, of course, very difficulty to assure proper registry of these dots to secure the proper multicolor shaded halftone effect in the final print. The weakness of the dots from a mechanical point of view has already been discussed heretofore above.

The use of line screens in the present invention eliminates this mechanical weakness problem since the lines of the halftone line screen run parallel to or in the direction of printing, especially important in the art of printing cans or other cylindrical objects. This eliminates the necessity of having proper close registry as is required in dot type overprinting or offset techniques.

Moreover, the lines running parallel to the direction of printing do not present the relatively weak and narrow profile that a raised dot system involves. Since the lines of the line engraved press plate run parallel to the printing direction or parallel to the mechanical stress, there is no narrow support shoulder to flex or bend as in the case of a raised dot, but rather an elongated raised island where the stress in printing runs longitudinally thereof in the printing direction.

The method of color separation employed and described particularly herein is not critical and a variety of well known techniques may be employed for that purpose, including separate layups of color done on acetate which may be employed in lieu of the transparencies prepared by photographic color separation techniques. The one important factor is that the art work be done in the original colors without blending and that only white be used as a diluent of color strength. If done photographically, it is important that the colors be separable by the use of filters. Primary colors such as magenta, cyan blue and yellow, for example, represent readily separable primary colors.

DESCRIPTION OF THE PREFERRED EMBODIMENTS

Figure 1:
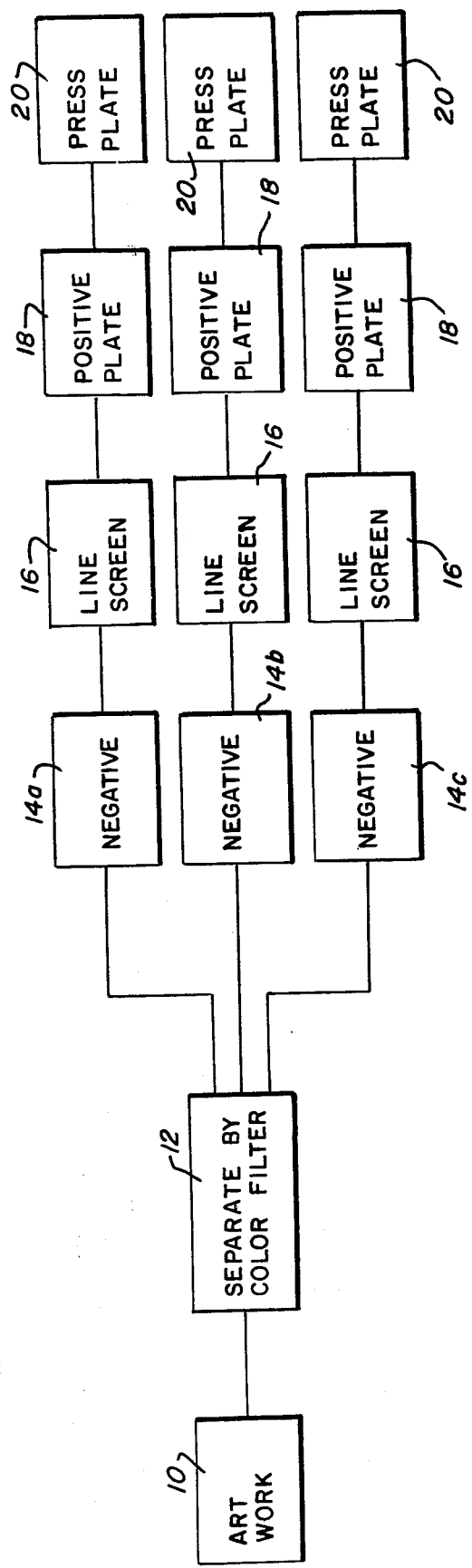
FIG. 1 is a diagrammatic representation illustrating the major steps for preparing a set of line engraved printing plates and for printing multicolor halftone simulated images in accordance with this invention.

Referring to FIG. 1 of the drawings, there is illustrated in schematic fashion a general method of preparing line engraved press plates from original art work. The art work schematically illustrated by box 10 is done up in original colors, such as, for example, blue, dark green and light green, and is separated by the use of color filters wherein continuous tone negatives are prepared by photographing the original art work through the appropriate filter which substantially eliminates any color except that originally employed in making the drawing. The color separation step is illustrated by box 12 and the negatives by the boxes 14a, 14b and 14c. Each of the negatives 14a, 14b and 14c, respectively represent the continuous toned negative of the original art work in blue, dark green and light green, respectively. These negatives are employed to produce a positive plate using a line screen halftone to establish the necessary linearity. This separates the image from the continuous tone negative into a halftone positive transparency. The spacing on the halftone line screens may be any particular dimension, but for good optical results in the final printed product, it should be about a hundred lines per inch. Other screens such as from 75 to 120 lines per inch may also be employed as well as finer halftone screens going up to about 200 lines per inch may be employed for even greater fineness of detail in the final product. It should be understood that the use of fewer lines per inch results in a coarser final printed product which does not have the desirable halftone effects sought to be achieved.

The line screens in the schematic process of FIG. 1 are illustrated by the boxes 16, which are, of course, all the same lining for a particular printing operation. The positive plates or transparencies designated by the numeral 18 are then employed to make the final press plate. Due to the fact that a line screen was employed to make the positive transparencies, they are already halftone impressions. These are applied or laid over the press plate, customarily, a photosensitized polymeric material and exposed to light. The separate press plates are then processed by etching and the raised portion representing only the particular color reproduced in the positive halftone transparency is the actual printing surface which is used to prepare the printed or lithographed offset image. Line screens are oriented with respect to the original art work so that the raised lines in the line engraved press plates 20 run in the direction of the printing process. These printing press plates are then incorporated into a suitable offset printing apparatus or lithographing apparatus, separately inked, and the inked image representing the separate and distinct colors applied to an offset surface, customarily a rubbery blanket, in register, and the composite image is then transferred from the offset surface to a workpiece.

Figure 2:
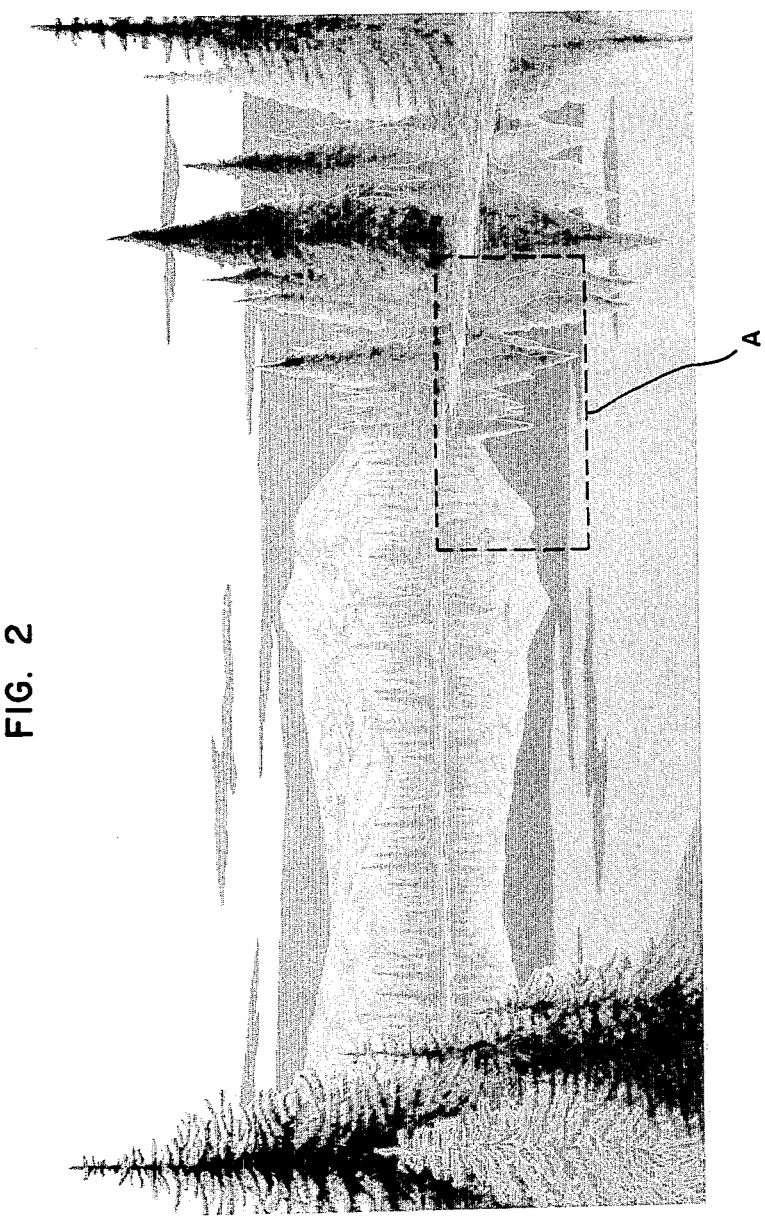
FIG. 2 is a printed image done in black and white of a water reflection scene adapted to be printed in three colors by means of three separate single color line engraved printing plates prepared in accordance with this invention.

Referring to FIG. 2, there is illustrated a printed image, run for purposes of this application in black and white, of a water reflection scene and prepared by the process of the present invention. Each of the several colors is separated by white.

Figure 3:
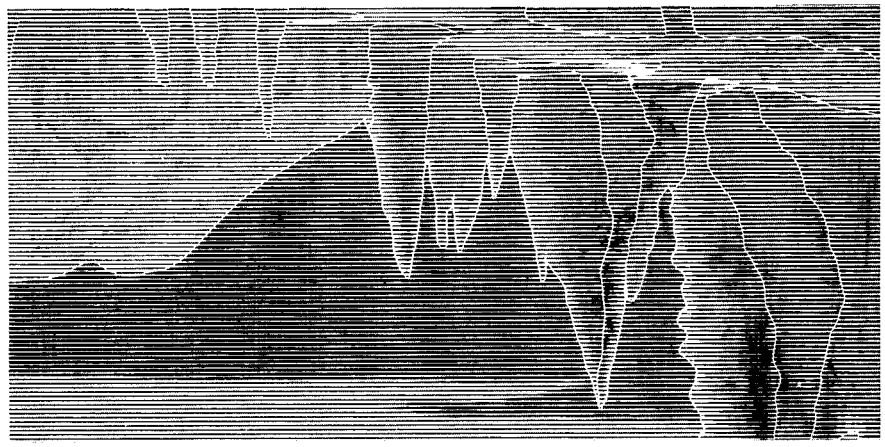
FIG. 3 is an enlarged portion of the printed image of FIG. 2 taken within the area indicated by dotted lines.

FIG. 3 is an enlarged portion of the printed image of FIG. 2 taken within the area indicated by dotted lines and designated by the letter "A". This enlargement, approximately three times or 3X, clearly shows the several colors employed and the separation of these colors by white. The linearity of the color applied by each of the engraved line press plates is also more clearly illustrated.

Figure 4:
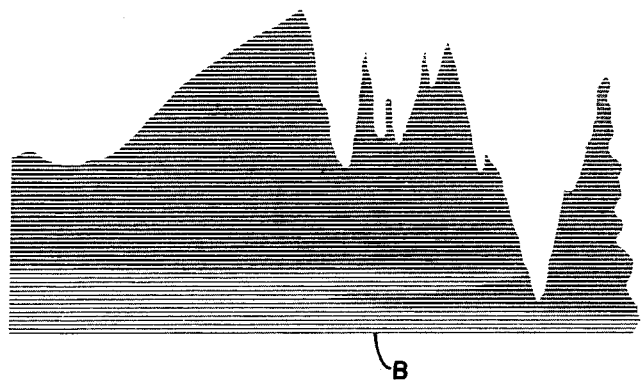
FIG. 4 is a print from the first of the single color line engraved printing press plates utilized in printing the enlarged portion of the scene of FIG. 3, this particular plate being adapted to print a first selected color, e.g. blue.
Figure 5:
FIG. 5 is a print from the second of the single color line engraved printing plates utilized in printing the enlarged portion of the scene of FIG. 3, this particular plate being adapted to print a second selected color, e.g. dark green.
Figure 6:
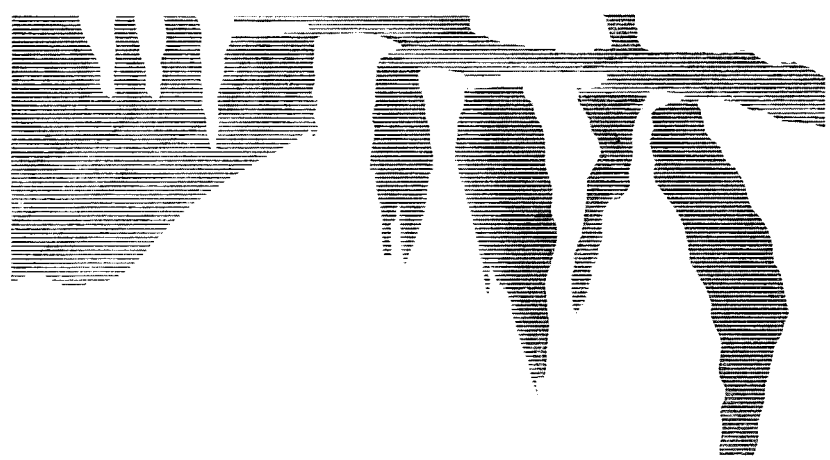
FIG. 6 is a print from the third of the single color line engraved printing plate utilized in printing the enlarged portion of the scene in FIG. 3, this particular plate being adapted to print a third selected color, e.g. light green.

FIGS. 4, 5 and 6 are printed images obtained by using the line engraved press plates prepared by the process of the invention to apply a single color. An enlargement of FIG. 3 represents the composite application of the color as it would appear on the offset surface or on the final workpiece product after lithographing or printing. In FIG. 4 the color applied would be blue and the shading that is seen in the lower portion of that figure represented by light tones and designated by the letter "B" are merely finer shadings of the same blue color. Likewise, FIG. 5 represents the application of a darker green coloration of ink, and FIG. 6 of a lighter green.

The total effect is substantially that shown in FIG. 2 showing the halftone effect created to the observer of the final printed product. While that figure is done in black and white, it is readily apparent the colors would add substantially to the visual enjoyment of the final printed product and that the halftone effects are clearly present in the final image.

Figure 7:
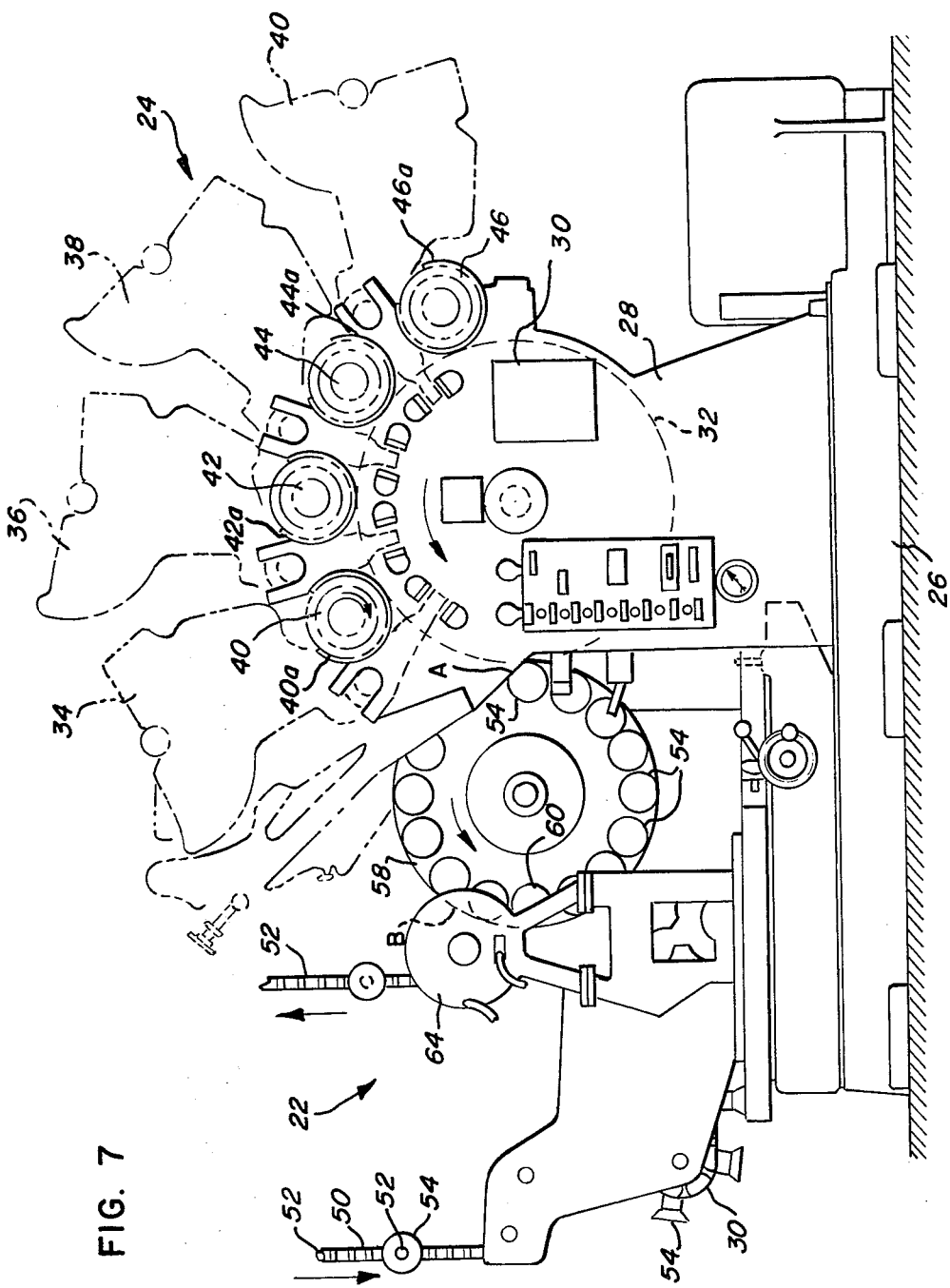
FIG. 7 is a schematic side elevation of a high speed rotary can printer apparatus which is used in conjunction with this invention to lithograph cylindrical objects such as cans with images such as are shown in FIG. 3 using the line engraved press plates prepared by the method of this invention.

Referring to FIG. 7 of the drawings, there is illustrated in schematic fashion, a so-called high-speed can printing press of the type described in numerous patents to Brigham and others, for example, U.S Pat. No. 3,371,603; U.S. Pat. No. 3,223,028; and U.S. Pat. No. 3,227,070. This device is also known as the Rutherford High Speed Can Printing Press and is sold by the Rutherford Machinery Division of the Sun Chemical Corporation. It is intended to incorporate the disclosure of those patents herein for the purpose of describing the apparatus used to carry out the present invention. The drawing illustrates a can handling and feeding mechanism 22 and a can printing assembly 24. These two units are assembled together on a base or frame 26. The printing assembly 24 is mounted on the base 26 with a supporting element 28. Rotably affixed to the supporting element 28 is a rotating printing turret or wheel 30 which has an offset printing surface on the outer circumference thereof designated by the numeral 32. A plurality of inking units 34, 36 and 38 and 40 are disposed circumferentially around the printing turret or wheel 30. Each of the inking and printing units has a printing wheel at the bottom thereof designated by the numerals 40, 42, 44 and 46, respectively. These printing wheels or cylinders are also termed plate cylinder assemblies. The line engraved printing or press plates affixed to the printing cylinders 42 through 46 are designated by the numerals 40a, 42a, 44a and 46a, respectively.

Figure 8:
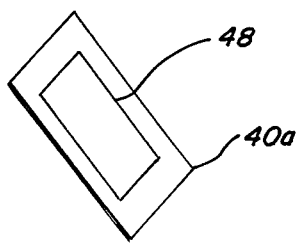
FIG. 8 is a perspective view of a line engraved press plate used in the present invention.
Figure 9:
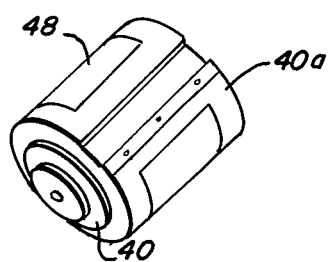
FIG. 9 is a perspective view of a printing cylinder with the press plate of FIG. 8 affixed for use in the apparatus and process of this invention.

FIG. 8 illustrates a typical line engraved flexible press plate designated by the numeral 40a, and the actual line engraving portion is designated by the rectangular section 48. A typical inking unit printing cylinder 40 is illustrated in FIG. 9 showing the press plate 40a affixed thereto.

Referring again to FIG. 7, there is illustrated in the can handling portion thereof 22 a conveyor chain 50 having a plurality of pins 52 affixed thereto adapted to carry a can body which is formed from a single piece of metal or other material and is generally cup-shaped in configuration. The can or workpiece 54 is carried by the chain conveyor and fed to a spindle wheel 58 by a series of feeding mechanisms. The spindle wheel 58, which may also be referred to as a spindle disc, operates intermittently so that a can is placed on one of the spindles 60 which are arranged circumferentially around the spindle disc 58 at the same time that a can is presented to the surface 32 of the printing wheel 30 at the point designated by the letter "A". The spindle disc 58 operates in a counter-clockwise fashion as shown by the arrow. The composite image is applied to the offset surface 32 of the printing wheel 30 by means of the printing wheels 40 through 46, having affixed thereto the line engraved printing mats 40a, 42a, 44a and 46a. Each of these line engraved press mats has applied thereto a different color in each of the inking stations 34 through 40. In the specific embodiment illustrated there are four inking stations. In the illustration shown in the drawings, FIGS. 1 through 6, the printed image is a three-color image, so that one of the stations would be rendered inoperative. In the printing process, however, as many stations as are desired, usually at least 3, provide a color for the particular line engraved press plate on the respective printing cylinder. For example, cylinder 46 provides an impression of a predetermined color and cylinder 44 would apply the second color, 42 the third, and cylinder 40 the fourth color. Each of these would be applied in registry with the previously applied color so that when the offset wheel 30 rotates past the printing cylinder 40 in its clockwise rotation it will have on its surface a composite image representing as many colors as are applied by the inkling stations and mats that have contacted the offset surface 32. This composite image contacts the can 54 at point A and is transferred from the offset surface 32 to the can surface or workpiece 54. After the printing operation the spindle disc moves up one can and the next can or workpiece has an image applied to it and the sequence continues. The can with the printed surface continues to rotate on the spindle disc and is removed at point B by removal device 64 and is removed from the work area by the conveyor chain 52 for packaging and shipment. Generally speaking, the offset surface 32 is of such circumference compared to that of the printing cylinder surface so as to accommodate four images at the same time. Accordingly, a single rotation of wheel 30 would result in reproduction of four offset printings on four individual can surfaces.

It should be understood that as indicated in the foregoing the line engraved press plates applied to the printing cylinders are aligned so that the lines of the engraved surface run in the machine direction or in the direction of printing. It has been found that this expedient reduces wear and tear on the plates and permits high speed operations for an extended period of time without break down, smearing or damaging of the line engraved press plates. The process and apparatus of the present invention is capable of carrying out printing of multi-color halftone impressions on cylindrical or can surfaces without the use of the typical screen press plates that have been commonly associated with the lithographing or offset printing art. The use of line engraved press plates reduces the problems associated with the so-called dot system of halftone multi-color printing wherein angular register was a very carefully controlled aspect of the printing process. Since there is no overprinting by this method, there is no necessity for observing the careful tolerances that are required in the dot offset multi-color procedures.

What is claimed is:

1. A method for printing multicolor images having half-tone visual qualities which has no overprint of colors, which comprises:

a. preparing the art work in pre-selected colors without color blending and using white as a diluent of color strength, which art work colors are color separable by optical filters;

b. forming a series of color separated transparencies employing optical filters representing the original artwork colors;

c. forming a series of line screen color reversal transparencies from the separated transparencies first prepared;

d. forming a series of flexible line engraved printing press plates from said line screen transparencies wherein each line engraved press plate corresponds to one of the colors in the original art work and wherein the printed image from each of said line engraved press plates in the composite printed image made therefrom is separated from the color print image of the other press plates by a field color and the lines of the respective press plates are parallel to each other and run in the direction of the rotation of the printing cylinder during printing;

e. applying ink in appropriate colors to each of the line engraved printing press plates;

f. applying sequentially the inked line engraved printing press plates to a sector of a cylindrical offset printing surface in register to form a composite image so that each separate inked color image applied to said offset surface is separated from the other colors applied by a neutral field color on a workpiece;

g. transferring the composite multicolor image from the offset surface to a cylindrical can workpiece by rotational engagement with a composite image on the offset surface on the outer circumference of said can to print a multicolor image thereon having halftone visual qualitites without color overprinting or blending; and h. maintaining the orientation of the lines of the press plates in the direction of the rotation of the printing cylinder during printing.

2. A method for printing multicolor images having halftone visual qualities and characterized by the absence of overprinting which comprises:
   a. preparing a series of line engraved flexible printing press plates from art work which is done in original pre-selected colors without color blending wherein each of the press plates represents a printing means for the colors used on the original art work without blending of color;
   b. inking said plates in the desired colors corresponding to the original art work and forming a composite multicolor wet ink image on a cylindrical printing offset surface by applying said inked plates thereto in register and without substantial overlap or overprint of the several colors;
   c. transferring the composite multicolor wet ink image from the offset printing surface to a cylindrical can workpiece by rotational engagement of the cylindrical offset surface and the cylindrical surface of the workpiece; and
   d. maintaining the parallel engraved lines of the press plates parallel to each other and oriented in the direction of the rotation of the offset printing cylinder and the cylindrical workpiece during printing of the cylindrical workpiece.

* * * * *

UNITED STATES PATENT OFFICE
CERTIFICATE OF CORRECTION

PATENT NO. : 3,948,171
DATED : April 6, 1976
INVENTOR(S) : Richard E. O'Connell

It is certified that error appears in the above-identified patent and that said Letters Patent are hereby corrected as shown below:

Col. 1, l. 64 - "printing" should be
-- printed --

Col. 3, l. 21 - "d." should be -- e. --

Col. 3, l. 23 - Before "applying" insert
-- f. --

Col. 6,
ll. 26-30 - Reading "clearly...illustrated"
should not be in bold
face type.

Col. 7, l. 1, - "36 and 38" should be
-- 36, 38 --

Col. 7, l. 55 - "inkling" should be -- inking --

Signed and Sealed this

Fourteenth Day of September 1976

[SEAL]

Attest:

RUTH C. MASON
Attesting Officer

C. MARSHALL DANN
Commissioner of Patents and Trademarks